United States Patent [19]

Fukaya et al.

[11] Patent Number: 4,581,099
[45] Date of Patent: Apr. 8, 1986

[54] METHOD FOR PREPARATION OF A PHOTOSENSOR

[75] Inventors: Masaki Fukaya; Teruhiko Furushima, both of Yokohama; Yuichi Masaki, Kawasaki; Seiji Kakimoto, Yokohama, all of Japan

[73] Assignee: Canon Kabushiki Kaisha, Tokyo, Japan

[21] Appl. No.: 696,521

[22] Filed: Jan. 30, 1985

[51] Int. Cl.$^4$ .................. C23F 1/02; H01L 21/306
[52] U.S. Cl. ........................... 156/643; 29/572; 156/646; 156/652; 156/656; 156/657; 156/659.1; 156/662; 204/192 E; 427/38; 252/79.1
[58] Field of Search .................. 29/572; 136/244, 258; 156/643, 646, 652, 656, 657, 659.1, 662; 427/38, 39; 204/164, 192 EC, 192 E; 357/30, 65, 67, 71; 252/79.1

[56] References Cited

U.S. PATENT DOCUMENTS

| 4,069,095 | 1/1978 | Lorenze et al. | 29/572 X |
| 4,281,208 | 7/1981 | Kuwano et al. | 29/572 X |
| 4,366,229 | 12/1982 | Freeman | 156/652 X |
| 4,390,394 | 6/1983 | Mathuni et al. | 156/643 |

Primary Examiner—William A. Powell
Attorney, Agent, or Firm—Fitzpatrick, Cella, Harper & Scinto

[57] ABSTRACT

A method for preparing a photosensor having electrodes formed on a photoconductive layer through an intermediary ohmic contact layer is provided which comprises forming an ohmic contact layer on a photoconductive layer, forming electrodes with a desired shape on the ohmic contact layer, then removing the ohmic contact layer at the exposed portion for photoelectric transducing by the etching method and thereafter applying heat treatment, thereby forming a photosensor array.

12 Claims, 9 Drawing Figures

METHOD FOR PREPARATION OF A PHOTOSENSOR

BACKGROUND OF THE INVENTION

1. Field of the Invention

This invention relates to a method for preparation of a photosensor which is used for the taking out of light signals in a photoelectric transducing device for image information processing.

2. Description of the Prior Art

As the photoelectric transducing means constituting the image reading portion such as in a facsimile, a digital copying machine, etc., photosensors have been used as generally well known in the art. Such photosensors may include, for example, planar type photoconductive photosensors which are prepared by imparting a pair of metal electrode layers confronted so as to form a gap for the light receiving portion on a photoconductive layer comprising chalcogenide, CdS, CdS-Se, or amorphous silicon (hereinafter written as "a-Si"). Since a photoconductive photosensor can form readily a line sensor array in continuous length, studies have been made thereon particularly in recent years. Above all, the photosensor employing a-Si as the photoconductive layer is excellent particularly in light response and expected to be a photosensor capable of high speed reading.

Figure 1:
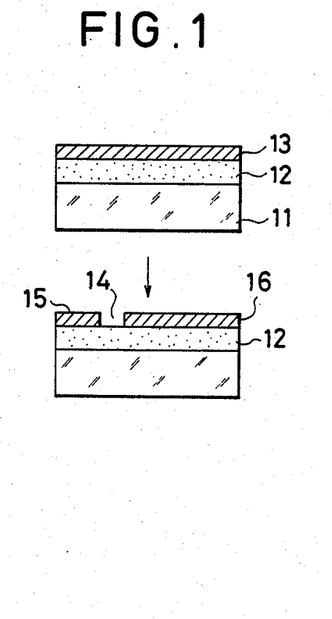
FIG. 1 is a sectional view showing the method for preparation of a photosensor of the prior art.
Figure 2:
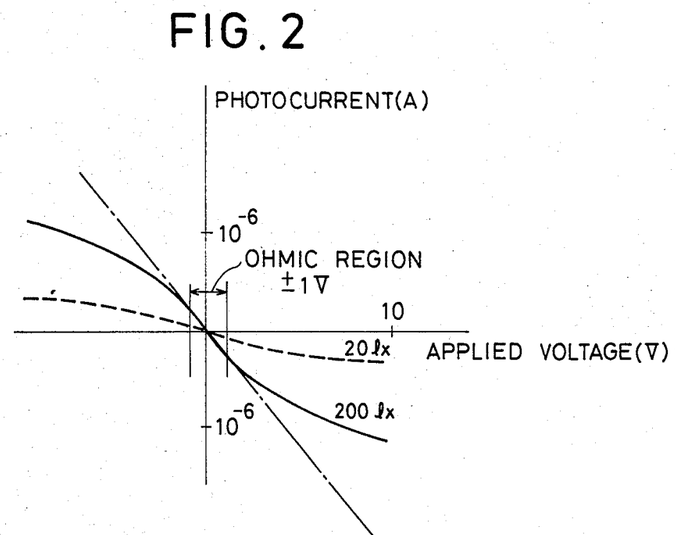
FIGS. 2 and 3 are graphs of V-I characteristics in photosensors.
Figure 3:
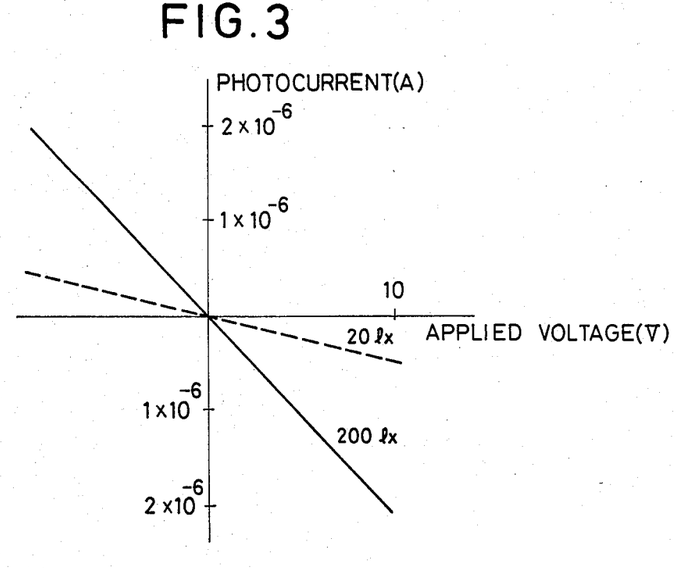

FIG. 1 is a schematic sectional view showing one example of the method for preparation of a planar type photosensor of the prior art. On a glass substrate, for example, a glass substrate 11 made of #7059 produced by Corning Co., a photoconductive layer of a-Si (intrinsic layer) 12 is deposited by use of the plasma CVD (PCVD) method, Al layer is formed uniformly all over the surface thereof and then Al at the unnecessary portion is removed to form a sensor gap 14 for the photoelectric transducing portion, thus forming a pair of electrodes 15 and 16. FIG. 2 shows an example of the V-I characteristics during light irradiation in a photosensor with a sensor gap of 200μ. According to this Figure, it can be seen that, when the electric field intensity exceeds approximately 50 V/cm, the diode in opposite direction existing at the interface between the electrodes 15 and 16 and the photoconductive layer 12 becomes predominant, whereby no ohmic characteristic can be exhibited (non-ohmic region). At the same time, in this region, response of the photosensor to the turning-on or turning-off of light becomes very slow, and giving no high performance. Accordingly, it has been practiced to provide an n+ layer which is an ohmic contact layer interposed at the interface between the a-Si photoconductive layer 12 and the electrodes 15 and 16, thereby permitting the ohmic characteristic to be exhibited even under a high electrical field. FIG. 3 shows an example of the V-I characteristics during light irradiation of a photosensor having such an n+ layer.

Whereas, since a-Si is lower in heat resistance than crystalline silicon, it is impossible to use ion implantation or thermal diffusion as a means for doping for the n+ layer formation. Accordingly, the n+ layer which is an ohmic contact layer is generally formed according to the PCVD method by use of a starting gas for PVCD in which a doping gas such as PH3, AsH3, etc. is incorporated. Thus, the n+ layer is deposited uniformly all over the surface, and therefore the n+ layer at the portion corresponding to the sensor gas needs to be removed, and the n+ layer between the adjacent bits also needs to be removed when preparing a line sensor in continuous length. As a means for removing the n+ layer, there are the methods in which etching is effected with a mixture of hydrofluoric acid, nitric acid and acetic acid (the wet etching method) and the method in which etching is effected by plasma discharging of a gas composed mainly of a carbon halide (the plasma etching method). However, these etching methods known in the art involve drawbacks as described below.

(A) The drawbacks of the wet etching method:

(1) dangling bonds will increase at the etched surface to increase the dark current, which is the noise component;

(2) etch pits will be formed on the surface even by use of an etchant with an etching rate of 100 Å/sec;

(3) selectivity for the n+ layer and the photoconductive layer is too great with the above etchant, whereby the n− layer existing at the interface between the n+ layer and the photoconductive layer cannot be removed, which brings about an increase in dark current or an increase in variance of characteristics;

(4) the glass substrate surface is roughened by hydrofluoric acid contained in the etchant, and therefore the light quantity reaching the photoelectric converting portion is reduced in a photosensor of the form in which light is permitted to enter from the glass substrate side.

(B) The drawbacks of the plasma etching method:

(1) The surface subjected to etching has increased dangling bond, to increase the dark current, which is the noise component;

(2) Implantation of the cathode material such as SUS occurs.

Accordingly, only photosensors with low S/N ratio and great variance in performance could be prepared by use of either the etching method or the plasma etching method.

SUMMARY OF THE INVENTION

An object of the present invention, in view of the prior art as described above, is to provide a photosensor which is high in S/N ratio and excellent in uniformity.

According to the present invention there is provided a method for preparing a photosensor having electrodes formed on a photoconductive layer through an intermediary ohmic contact layer, which comprises forming an ohmic contact layer on a photoconductive layer, forming electrodes with a desired shape on the ohmic contact layer, then removing the ohmic contact layer at the exposed portion for photoelectric transducing by the etching method and thereafter applying heat treatment.

DETAILED DESCRIPTION OF THE PREFERRED EMBODIMENT

Referring now to examples, the present invention is to be described in detail.

Figure 4:
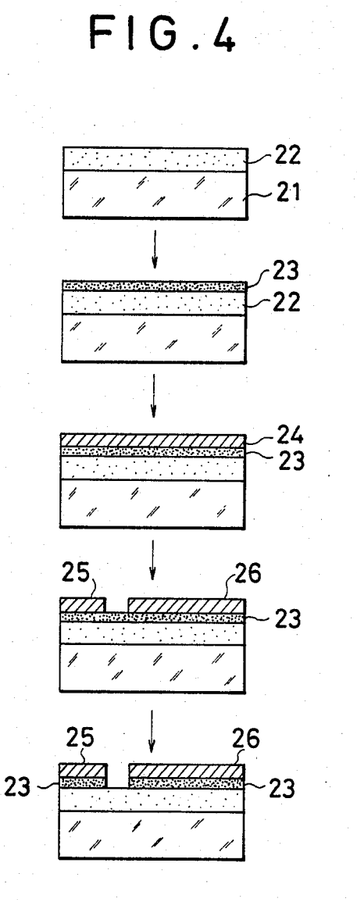
FIG. 4 is a sectional view showing the method for preparation of a photosensor of the present invention.
Figure 5:
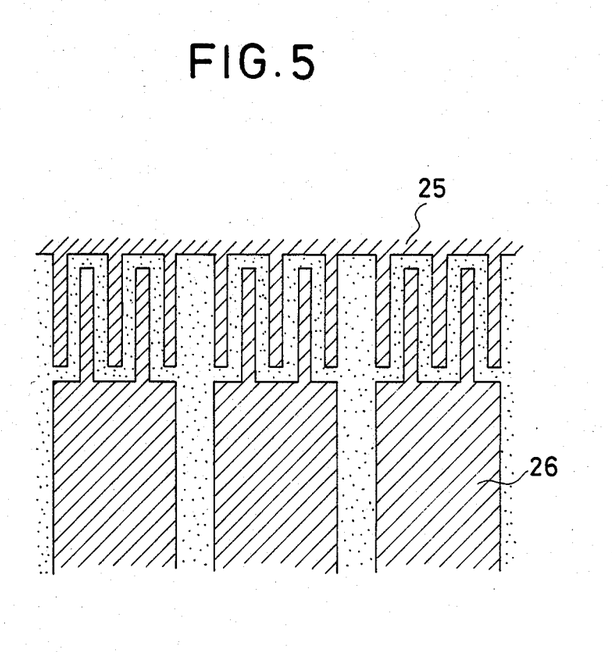
FIG. 5 is a partial plan view of the photosensor array obtained according to the method for preparation of a photosensor of the present invention.

FIG. 4 is a schematic sectional view for illustration of a preferred embodiment of the method for preparation of a photosensor according to the present invention, and FIG. 5 is a schematic partial plan view of the line sensor array in continuous length obtained by the preparation method of the present invention.

First, on a glass substrate (#7059, produced by CORNING CO.) 21 was provided a photoconductive layer (intrinsic layer) 22 comprising a-Si layer by the glow discharge method. That is, a photoconductive layer 22 with a thickness of $0.7\mu$ was obtained by depositing $SiH_4$ gas diluted to 10 vol. % with $H_2$ under the conditions of a gas pressure of 0.50 Torr, RF (radio Frequency) power of 10 W and a substrate temperature of 250° C. for 2 hours. Similarly, by the glow discharge method, an n+ layer 23 was provided. That is, an n+ layer 23 with a thickness of $0.1\ \mu$ was provided continuous to the photoconductive layer 22 by use of a gas mixture of $SiH_4$ dilutes to 10 vol. % with $H_2$ and $PH_3$ diluted to 100 ppm with $H_2$ at a mixing ratio of 1:10 as the starting material, under otherwise the same conditions as in deposition of the photoconductive layer 22. Next, Al was deposited to $0.3\mu$ thickness by the electron beam vapor deposition method. Subsequently, the photoconductive layer 24 at the portion for the photoelectric transducing portion was removed. That is, after formation of a photoresist pattern to a desired shape with the use of a positive type MICROPOSIT 1300-27 (trade name, produced by Shipley Co.), the photoconductive layer 24 at the exposed portion was removed with an etchant comprising a mixture of phosphoric acid (85 vol. % aqueous solution), nitric acid (60 vol. % aqueous solution), glacial acetic acid and water at a volume ratio of 16:1:2:1 to form a common electrode 25 and individual electrodes 26. Next, the n+ layer 23 at the portion for photoelectric transducing was removed. That is, after the above MICROPOSIT 1300-27 photoresist was peeled off, dry etching with $CF_4$ gas was effected by a plasma etching method (also called a reactive ion-etching method) by means of a parallel flat plate type plasma etching device (DEM-451, produced by Nichiden Anelva Co.) under the conditions of RF power of 120 W and a gas pressure of 0.1 Torr. In this Example, for prevention of implantation of the cathode material of the etching device, a target for sputter of polysilicon (8 inch $\phi$, purity 99.999%) was placed on the cathode, on which the sample was mounted, with the portion where SUS of the cathode material was exposed being covered with a Teflon sheet cut out in the shape of a doughnut, and etching was effected under the state where the SUS surface was not substantially exposed to the plasma. Then, heat treatment was carried out in an oven under flow of nitrogen at 3 liter/min. at 200° C. for 60 minutes.

Figure 6:
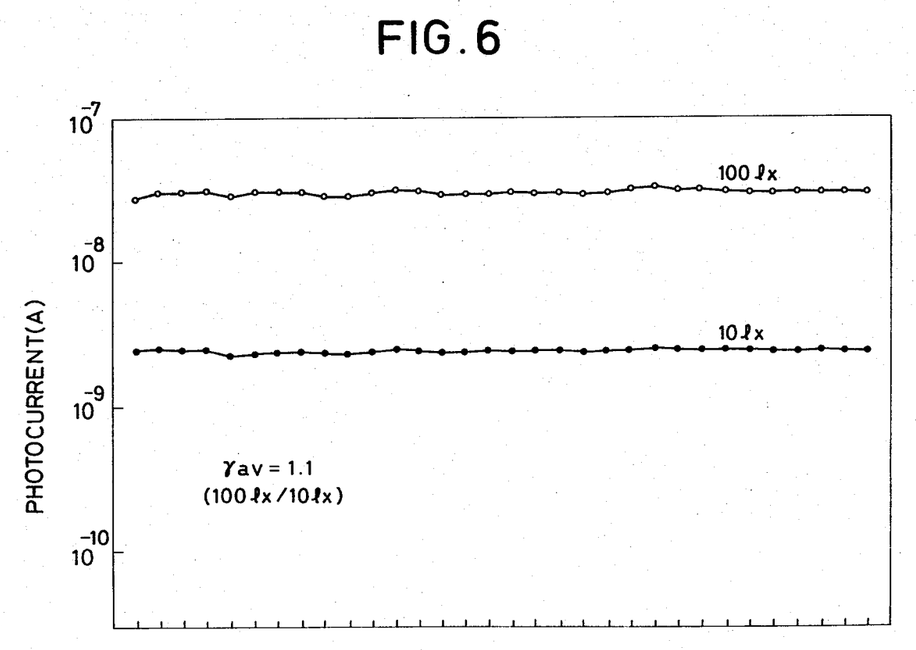
FIGS. 6 and 7 are graphs showing uniformness of photosensors.

In the thus prepared photosensor array in continuous length as shown in FIG. 5, the respective 32 photosensors were illuminated at a uniform illuminance to obtain the data of uniformity of the photocurrent as shown in FIG. 6. The data show the photocurrent in the case of a gap width of $10\mu$ between the common electrode 25 and the individual electrode 26, an applied voltage of 10 V between the common electrode 25 and the individual electrode 26 and illuminance of 100 lux and 10 lux at the photoelectric transducing portion. The data of photoresponse time ($\tau$) of the above photosensor array are also shown in Table 1.

TABLE 1

| Photosensor: | 2nd bit | 16th bit | 31st bit |
| --- | --- | --- | --- |
| $\tau_{on}$ | 3.0 msec | 3.5 msec | 3.2 msec |
| $\tau_{off}$ | 3.2 msec | 3.3 msec | 3.0 msec |

In the above Table, $\tau_{on}$ and $\tau_{off}$ show the time before the photocurrent reaches the saturated value of 100 lux minus 10% and minus 90%, respectively, when the illuminance was increased from 10 lux to 100 lux and decreased from 100 lux to 10 lux in pulse. In general, the photo-response speed is governed by the slower one of $\tau_{on}$ and $\tau_{off}$.

Figure 7:
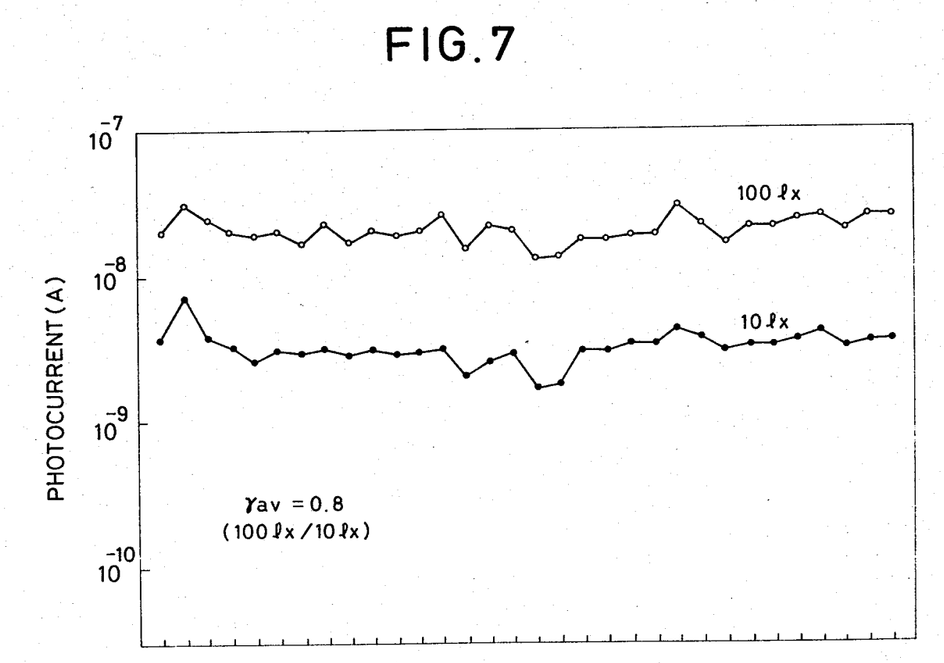

For comparative purpose, uniformity of the photocurrent was also measured for the photosensor array which was prepared in entirely the same manner as in the above preparation steps except that no heat treatment was carried out. The data are shown in FIG. 7. The photo-response time ($\tau$) was also similarly measured to obtain the data as shown in Table 2.

TABLE 2

| Photosensor: | 2nd bit | 16th bit | 31st bit |
| --- | --- | --- | --- |
| $\tau_{on}$ | 0.7 msec | 1.4 msec | 0.8 msec |
| $\tau_{off}$ | 10 msec | 15 msec | 9 msec |

From the above results, it can be understood that the following advantages can be obtained by carrying out heat treatment after plasma etching:

(1) uniformity is markedly improved;

(2) the $\gamma$ value, which is the increased index of the photocurrent accompanied with increase of light quantity as given by $(I_{photo-2}/I_{photo-1}) = (F_2/F_1)^\gamma$ is improved to give a value exceeding 1;

(3) photo-response time $\tau_{on}$ and $\tau_{off}$ are well balanced, and particularly $\tau_{off}$ is markedly shortened.

As the result, there was obtained a photosensor array which was high in S/N ratio and excellent in uniformity, and also capable of high speed reading.

Figure 8:
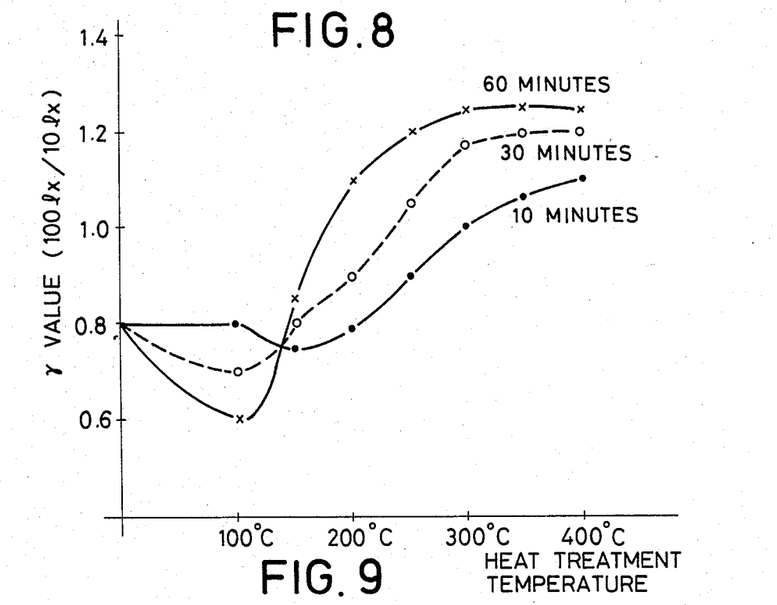
FIGS. 8 and 9 are graphs showing photosensor performance characteristics depending on the temperature and time for heat treatment.
Figure 9:
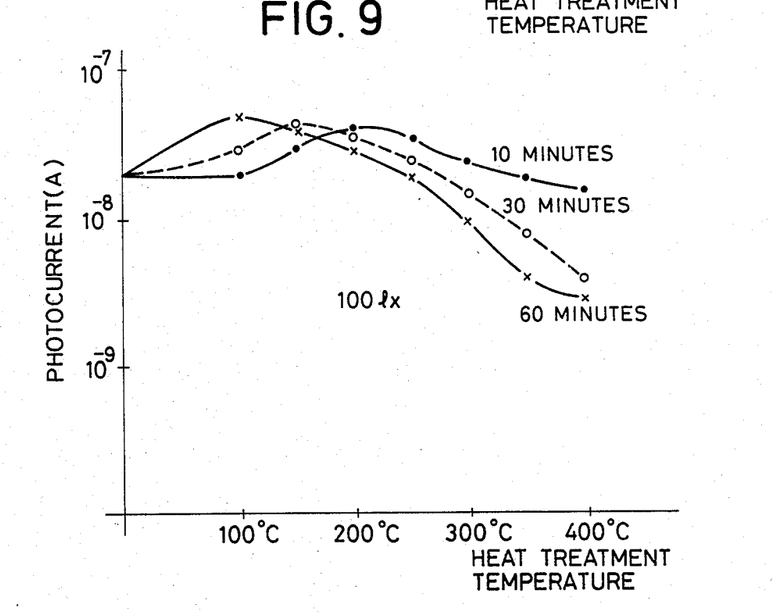

Next, dependency of the photosensor array performance on the heat treatment temperature and time was examined. The results are shown in FIG. 8 and FIG. 9. FIG. 8 shows the data for $\gamma$ value, and FIG. 9 the data of photocurrent values under the illuminance of 100 lux. Although the $\gamma$ value is increased with the increase of the temperature and the time, the photocurrent is decreased at the same time. In particular, it is preferred to carry out the heat treatment in an atmosphere at 150° to 200° C. for 30 minutes or longer, or at 200° to 250° C. for 20 minutes or longer, or at 250° to 300° C. for 10 to 60 minutes, or at 300° to 350° C. for 5 to 30 minutes.

The gas to be used in the plasma etching step in the preparation method of the present invention is not limited to $CF_4$, but gases composed mainly of halogenated hydrocarbons, such as $CHF_3$, $CCl_2F_2$, $CF_3Br$, $CF_4+Cl_2$, $CF_4+O_2$ and $CF_4+H_2$, may be available and similar results were obtained also in these cases.

The atmosphere for the heat treatment in the preparation method of the present invention is not limited to $N_2$, but $H_2$, Ar, dry air and vacuum may also be used.

The causes for improvement in characteristic of the photosensor by the heat treatment in the preparation method of the present invention may be speculated to be the relaxation of the film stress and termination of dangling bonds by halogen atoms such as F remaining on the surface of a-Si photoconductive layer during plasma etching.

Also, in the photosensor prepared by removal of the n+ layer by a wet etching method, slight improvement in characteristics can be observed, but no practically serviceable product was obtained due to the markedly great dark current inherently possessed.

According to the method for prepraration of a photosensor of the present invention as described above, there is provided a photosensor with high S/N ratio and excellent uniformity which is capable of high speed reading.

What we claim is:

1. A method for preparing a photosensor having electrodes formed on a photoconductive layer through an intermediary ohmic contact layer, which comprises forming an ohmic contact layer on a photoconductive layer, forming electrodes with a desired shape on the ohmic contact layer, then removing the ohmic contact layer at the exposed portion for photoelectric transducing by the etching method and thereafter applying heat treatment, thereby forming a photosensor array.

2. A method according to claim 1, wherein the photoconductive layer and the ohmic contact layer comprise an amorphous silicon as the matrix.

3. A method according to claim 1, wherein the etching method is plasma etching.

4. A method according to claim 3, wherein etching is performed with the use of a gas composed mainly of a carbon halide.

5. A method according to claim 1, wherein the heat treatment is conducted at a temperature of 350° C. or lower.

6. A method according to claim 5, wherein the heat treatment is conducted under the conditions selected from the following (A) to (D):
(A) 30 minutes or longer in an atmosphere of 150° to 200° C;
(B) 20 minutes or longer in an atmosphere of 200° to 250° C.;
(C) 10 to 60 minutes in an atmosphere of 250° to 300° C.; and
(D) 5 to 30 minutes in an atmosphere of 300° to 350° C.

7. A method according to claim 4, wherein the gas composed mainly of carbon halide is selected from $CHF_3$, $CCl_2F_2$, $CF_3Br$, $CF_4+Cl_2$, $CF_4+O_2$ and $CF_4+H_2$.

8. A method according to claim 1, wherein the heat treatment is conducted in $N_2$ atmosphere.

9. A method according to claim 1, wherein the heat treatment is conducted in $H_2$ atmosphere.

10. A method according to claim 1, wherein the heat treatment is conducted in Ar atmosphere.

11. A method according to claim 1, wherein the heat treatment is conducted in dry air.

12. A method according to claim 1, wherein the heat treatment is conducted under vacuum.

* * * * *

UNITED STATES PATENT AND TRADEMARK OFFICE
CERTIFICATE OF CORRECTION

PATENT NO. : 4,581,099
DATED : April 8, 1986
INVENTOR(S) : MASAKI FUKAYA, ET AL.

It is certified that error appears in the above-identified patent and that said Letters Patent is hereby corrected as shown below:

First page under U.S. PATENT DOCUMENTS: "4,069,095 .... 29/572X" add --R-- after "X".

"4,281,208 .... 29/572X" add --R-- after "X".

"4,366,229 .... 156/652X" add --R-- after "X".

Col. 2, line 29, change "bond" to --bonds--.

Signed and Sealed this

Twenty-first Day of October, 1986

[SEAL]

Attest:

DONALD J. QUIGG

Attesting Officer  Commissioner of Patents and Trademarks